United States Patent
Suehiro et al.

(10) Patent No.: US 7,029,156 B2
(45) Date of Patent: Apr. 18, 2006

(54) LIGHT EMITTING APPARATUS AND DISPLAY

(75) Inventors: Yoshinobu Suehiro, Aichi-ken (JP); Akihiro Misawa, Aichi-ken (JP); Osamu Yamanaka, Aichi-ken (JP); Toshinori Takahashi, Aichi-ken (JP); Hisatoshi Ota, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 54 days.

(21) Appl. No.: 10/309,330

(22) Filed: Dec. 4, 2002

(65) Prior Publication Data
US 2003/0123262 A1  Jul. 3, 2003

(30) Foreign Application Priority Data
Dec. 5, 2001  (JP) ............................... 2001-371586

(51) Int. Cl.
*F21V 7/09* (2006.01)
(52) U.S. Cl. ...................... 362/560; 362/301; 362/346; 362/609; 362/612; 362/613; 362/625
(58) Field of Classification Search ................. 362/26, 362/27, 30, 301, 327, 511, 541, 545, 800, 362/31, 297, 298, 346, 517, 518, 555, 560, 362/609, 612, 613, 623, 625, 626
See application file for complete search history.

(56) References Cited

U.S. PATENT DOCUMENTS

| | | | |
|---|---|---|---|
| 1,118,969 A * | 12/1914 | Thompson | 362/30 |
| 2,566,026 A * | 8/1951 | Hughes, Jr. | 362/26 |
| 4,342,908 A * | 8/1982 | Henningsen et al. | 313/500 |
| 4,432,039 A * | 2/1984 | Cibie | 362/511 |
| 4,737,896 A * | 4/1988 | Mochizuki et al. | 362/301 |
| 4,929,866 A * | 5/1990 | Murata et al. | 362/545 |
| 5,190,370 A * | 3/1993 | Miller et al. | 362/31 |
| 5,365,412 A * | 11/1994 | Koppolu et al. | 362/511 |
| 5,375,043 A * | 12/1994 | Tokunaga | 362/31 |
| 5,377,083 A * | 12/1994 | Tada | 362/31 |
| 5,590,945 A * | 1/1997 | Simms | 362/545 |
| 5,618,096 A * | 4/1997 | Parker et al. | 362/27 |
| 5,775,791 A * | 7/1998 | Yoshikawa et al. | 362/31 |

(Continued)

FOREIGN PATENT DOCUMENTS

JP  2001-189494  7/2001

(Continued)

*Primary Examiner*—Alan Cariaso
(74) *Attorney, Agent, or Firm*—McGinn IP Law Group, PLLC

(57) ABSTRACT

An opposed reflecting mirror is provided so as to face a light source. The opposed reflecting mirror is configured to reflect light rays, emitted from the light source, so as to allow the reflected light rays to advance in a predetermined direction. A light guide body having a plurality of reflecting surfaces is provided to permit the incidence of light rays supplied from the opposed reflecting mirror and to reflect the incident light rays. The plurality of reflecting surfaces are located at different positions in a sliding split manner along the direction of light rays supplied from the opposed reflecting mirror. By virtue of this construction, a light emitting apparatus can be provided in which, while making the best use of a feature of LED, i.e., a small thickness, impressive illumination of an elongated shape by one light emitting device and high external emission efficiency can be realized. The arrangement of a plurality of light emitting apparatuses of the above type at predetermined intervals can provide on-vehicle or other displays of a novel and unconventional design.

30 Claims, 7 Drawing Sheets

ZA: CENTRAL AXIS OF OPPOSED REFLECTING MIRROR 43A
ZB: CENTRAL AXIS OF OPPOSED REFLECTING MIRROR 43B
40: LIGHT EMITTING APPARATUS
41A, 41B: LIGHT GUIDE BODY
41a, 41b: PLURALITY OF REFLECTING SURFACES
42: LIGHT EMITTING DEVICE
43A, 43B: OPPOSED REFLECTING MIRROR
44: TRANSPARENT EPOXY RESIN

U.S. PATENT DOCUMENTS 6,250,778 B1 * 6/2001 Doumuki .................... 362/327
6,305,813 B1 * 10/2001 Lekson et al. ................ 362/31
6,367,957 B1 * 4/2002 Hering et al. ............... 362/511

FOREIGN PATENT DOCUMENTS

WO    WO 99/09349    2/1999

* cited by examiner

100: LIGHT EMITTING APPARATUS
101: LENTICULAR LED
102: LIGHT EMITTING DEVICE
103a, 103b: LEAD
104: WIRE
105: TRANSPARENT EPOXY RESIN
106: REFLECTING MIRROR
107: FRESNEL LENS
109: RESIN LENS

1: LIGHT EMITTING APPARATUS
2: LIGHT GUIDE BODY
3: SIDE FACE
4: SIDE FACE
5: UPPER SURFACE
6: LOWER SURFACE
6a: PLURALITY OF REFLECTING SURFACES
7: INCIDENT FACE
8: CUP-TYPE REFLECTION LED
9: TRANSPARENT EPOXY RESIN
9a: REFLECTING MIRROR
10: LIGHT EMITTING DEVICE

1: LIGHT EMITTING APPARATUS
11: ON-VEHICLE STOP LAMP

12: LIGHT EMITTING APPARATUS
13: PARABOLIC BODY OF REVOLUTION
13a: PARABOLOID OF REVOLUTION
13b: FLAT SURFACE
14: LIGHT EMITTING DEVICE
15: CIRCUIT BOARD
16: INSULATING LAYER
17: METAL BASE SUBSTRATE

18: LIGHT GUIDE BODY
19: SIDE FACE
20: SIDE FACE
21: LOWER SURFACE
21a, 21b, 21c: PLURALITY OF REFLECTING SURFACES
22: UPPER SURFACE
23: INCIDENT FACE

30: SPILIT REFLECTOR
31: REFLECTION SUBSTRATE
31a: PLURALITY OF REFLECTING SURFACES
32: FRAME

ZA: CENTRAL AXIS OF OPPOSED
   REFLECTING MIRROR 43A
ZB: CENTRAL AXIS OF OPPOSED
   REFLECTING MIRROR 43B
40: LIGHT EMITTING APPARATUS
41A, 41B: LIGHT GUIDE BODY
41a, 41b: PLURALITY OF REFLECTING
   SURFACES
42: LIGHT EMITTING DEVICE
43A, 43B: OPPOSED REFLECTING MIRROR
44: TRANSPARENT EPOXY RESIN

LIGHT EMITTING APPARATUS AND DISPLAY

The present application is based on Japanese Patent Application No. 2001-371586, the entire contents of which are incorporated herein by reference.

BACKGROUND OF THE INVENTION

1. Field of the Invention

The invention relates to a light emitting apparatus and a display that, through the utilization of a light emitting device or an LED lamp as a light source, can be applied, for example, to on-vehicle lights or other lighting units, display units and the like.

In this specification, an LED chip per se is referred to as "light emitting device," and the whole system including an LED chip-mounted package resin or lens system or other optical system is referred to as "light emitting diode," "LED," or "light emitting apparatus."

2. Related Art

An increase in brightness of light emitting devices has led to extensive use of light emitting apparatuses using LEDs as a light source, for example, in backlights of automobiles. LEDs have a narrow-band emission spectrum, and the emitted light has good visibility. Further, the speed of response of LED is so high that the speed of transmission of signals to following vehicles is high and, thus, the distance necessary for stopping the travel of vehicles during high-speed traveling can be significantly reduced. LEDs per se are a monochromatic light source. Therefore, unlike incandescent lamps, there is no need to cut off light rays other than light of necessary color through a filter, and monochromatic light sources with a high emission efficiency can be realized. This also leads to energy saving.

An example of this type of conventional light emitting apparatuses is shown in FIG. 1. FIG. 1 is a cross-sectional view showing the whole construction of the conventional light emitting apparatus. As shown in FIG. 1, in this light emitting apparatus 100, a lenticular LED 101 produced by sealing a light emitting device 102 with a transparent epoxy resin 105 to form a package in a convex lens form is used as a light source. In the production of this lenticular LED 101, the light emitting device 102 is mounted on one lead 103a of a pair of leads 103a, 103b, the light emitting device 102 is bonded to the lead 103b by a wire 104, and the whole assembly is sealed with the transparent epoxy resin 105 to form the package in a convex lens form. The periphery of the lenticular LED 101 is covered with a reflecting mirror 106 in the form of paraboloid of revolution. A Fresnel lens 107 is provided in an upper central part of the lenticular LED 101. Light rays radiated from the lenticular LED 101 are reflected from the reflecting mirror 106 or are collected in the Fresnel lens 107 and exit upward substantially parallel to one another. The substantially parallel light rays are spread by a concave/convex interface provided on the lower surface of a resin lens 109. The light rays passed through the resin lens 109 are radiated, to the outside of the system, as emitted light having a spread angle of about 20 degrees which meets the specifications of on-vehicle backlights.

In these days, the output of the light emitting device is more and more increased, and this makes it necessary to cover a predetermined emission area using a minimized number of light emitting devices from the viewpoint of reducing the necessary number of components and reducing the time necessary for mounting the components. There is also a demand, for example, for an on-vehicle backlight of a new design, in which linear light emitting apparatuses are arrayed at predetermined intervals. In the above light emitting apparatus 100, an attempt to cover a further elongated area by one light emitting device results in the necessity of a longer size in the area direction, as well as in the necessity of an increased size in the thicknesswise direction. An excessive reduction in thickness deteriorates impressiveness of light rays emitted to the outside of the system. This poses a problem that a thin light source, which is a feature of the LED, cannot be produced. Further, light rays, which have been emitted from the light emitting device 102 but have reached neither the reflecting mirror 106 nor the Fresnel lens 107, cannot be optically controlled and thus cannot be radiated to the outside of the system. Thus, the conventional light emitting device still has room for improvement in external emission efficiency.

SUMMARY OF THE INVENTION

Accordingly, it is an object of the invention to provide a light emitting apparatus that, while making the best use of a feature of LED, i.e., a small thickness, can realize impressive illumination of an elongated shape by one light emitting device and can realize high external emission efficiency.

It is another object of the invention to provide on-vehicle or other displays using the light emitting apparatus.

According to the first feature of the invention, a light emitting apparatus comprises a light source. An opposed reflecting mirror is provided so as to face the light source. The opposed reflecting mirror is configured to reflect light rays, emitted from the light source, to allow the reflected light rays to advance in a predetermined direction. A light guide body having a plurality of reflecting surfaces is provided to permit the incidence of light rays supplied from the opposed reflecting mirror and to reflect the incident light rays. The plurality of reflecting surfaces are located at different positions in a sliding split manner along the direction of light rays supplied from the opposed reflecting mirror.

According to this construction, light rays emitted from the light source are reflected from the opposed reflecting mirror to allow the reflected light rays to advance in a predetermined direction. The reflected light rays enter the light guide body, where the light rays are further reflected from the plurality of reflecting surfaces provided at different positions in a sliding split manner. In this case, upon the reflection of light rays from the light guide body, only the plurality of sliding-split-type reflecting surfaces shine. Since, however, the brightness of the reflected light rays is high, all the reflected light rays are connected to one another. As a result, the whole light guide body is artificially seen shiny.

Thus, a light emitting apparatus can be provided in which, while making the best use of a feature of LED, i.e., a small thickness, impressive illumination of an elongated shape by one light emitting device and high external emission efficiency can be realized.

According to the second feature of the invention, a light emitting apparatus comprises a light source. An opposed reflecting mirror is provided so as to face the light source. The opposed reflecting mirror is configured to reflect light rays, emitted from the light source, to allow the reflected light rays to advance in a predetermined direction. A split reflector having a plurality of reflecting surfaces is provided to permit the incidence of light rays supplied from the opposed reflecting mirror and to reflect the incident light rays from the surfaces thereof. The plurality of reflecting surfaces are located at different positions in a sliding split manner along the direction of light rays supplied from the opposed reflecting mirror.

The light emitting apparatus in the second feature of the invention is different from the light emitting apparatus in the first feature of the invention in that the incident light rays supplied from the opposed reflecting mirror are passed through only air atmosphere and are reflected from the surface of the split reflector. Since light rays are passed through only air atmosphere, there is no need to use a transparent material as the material of the split reflector. That is, any material may be used as the material of the split reflector so far as the surface of the material can be planished. Further, since the light rays are passed through the air atmosphere, advantageously, the quantity of light is not reduced at all. Here, upon the reflection of light rays from the split reflector, only the plurality of sliding-split-type reflecting surfaces shine. Since, however, the brightness of the reflected light rays is high, as with the first feature of the invention, all the reflected light rays are connected to one another. As a result, the whole split reflector is artificially seen shiny.

Thus, a light emitting apparatus can be provided in which, while making the best use of a feature of LED, i.e., a small thickness, impressive illumination of an elongated shape by one light emitting device and high external emission efficiency can be realized.

In the light emitting apparatus according to the first or second feature of the invention, the light source may be a light emitting device or an LED lamp comprising a light emitting device sealed with a light transparent material.

Since any of a light emitting device and an LED lamp may be used as the light source, displays of a novel design, such as on-vehicle lights, can be provided.

In the light emitting apparatus according to the first or second feature of the invention, preferably, the plurality of reflecting surfaces have been split also in a direction perpendicular to a direction of incidence of light rays supplied from the opposed reflecting mirror, and the split reflecting surfaces are different from each other or one another in distance from the opposed reflecting mirror.

According to this construction, the plurality of reflecting surfaces in the light emitting apparatus are split in the lengthwise direction, as well as in crosswise direction. In this case, the whole light guide body or the whole split reflector is not artificially seen shiny, and, instead, the brightness contrast is provided also in the light guide body per se or the split reflector per se. That is, reflected light rays are emitted at scattered positions, and, consequently, advantageously, emitted light rays are visually beautifully glittery. This can enhance the visibility of the emitted light rays.

In the light emitting apparatus according to the first or second feature of the invention, preferably, the light source is mounted on a wide substrate and the opposed reflecting mirror comprises a first reflecting surface and a second reflecting surface, a part of the wide substrate is attached to a body constituting the opposed reflecting mirror, the light source faces the first reflecting surface, the first reflecting surface is configured to reflect light rays emitted from the light source so as to allow the reflected light rays to advance in a predetermined direction, and the second reflecting surface is extended to the attached substrate and is configured to reflect light rays emitted from the light source so as to allow the reflected light rays to advance toward the first reflecting surface.

An example of the first reflecting surface is a paraboloid of revolution, and an example of the second reflecting surface is- a flat surface.

According to this construction, light rays emitted from the light source to the first reflecting surface are reflected, and the reflected light rays advance in a predetermined direction and are incident to the light guide body or the split reflector through the incident face thereof. On the other hand, light rays emitted from the light source to the second reflecting surface are reflected from the second reflecting surface. Thereafter, as with the light rays emitted from the light source to the first reflecting surface, the light rays reflected from the second reflecting surface are reflected from the first reflecting surface so as to allow the reflected light rays to advance in a predetermined direction, and the light rays reflected from the first reflecting surface are incident to the light guide body or the split reflector through the incident face thereof.

The above optical system is advantageous in that, even when a wide substrate is used, light rays emitted from the light source can be effectively emitted as condensed light to the light guide body or the split reflector.

In the light emitting apparatus according to the first or second feature of the invention, the opposed reflecting mirror is preferably a part of a paraboloid of revolution of which the focal point is the light emitting surface of the light source.

According to this construction, light rays emitted from the light source are reflected, from the opposed reflecting mirror, substantially parallel to the central axis of the paraboloid of revolution. Therefore, the light rays reflected from the opposed reflecting mirror can efficiently enter the reflecting surfaces of the light guide body or the split reflector and can be emitted to the outside of the system with high external emission efficiency.

According to the third feature of the invention, a display comprises a plurality of light emitting apparatuses of the type according to the first or second feature of the invention. In this display, the plurality of light emitting apparatuses are arrayed at predetermined intervals.

According to this construction, when the plurality of light emitting apparatuses are simultaneously lighted, the brightness of emitted light rays is so high that an area larger than an area obtained by multiplying the area of the light emitting apparatus by the number of light emitting apparatuses is seen shiny. Upon lights-out of the light emitting apparatuses, the appearance of the display is returned to the original state, in which the plurality of light emitting apparatuses are arrayed at predetermined intervals.

Thus, in the lights-out state, a novel and unconventional design can be observed in which the plurality of light emitting apparatuses are arrayed at predetermined intervals, while, in the lighted state, an area larger than an area obtained by multiplying the area of the light emitting apparatus by the number of light emitting apparatuses is seen shiny to allow the display to function as a display. Thus, a novel and unconventional display can be realized. Further, the thickness of the light emitting apparatus per se is so small that the arrangement of a plurality of this type of light emitting apparatuses can provide a thin and large-area display.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in conjunction with the accompanying drawings.

First preferred embodiment

The first preferred embodiment 1 of the invention will be explained in conjunction with FIGS. 2A, 2B, and 3.

Figure 1:
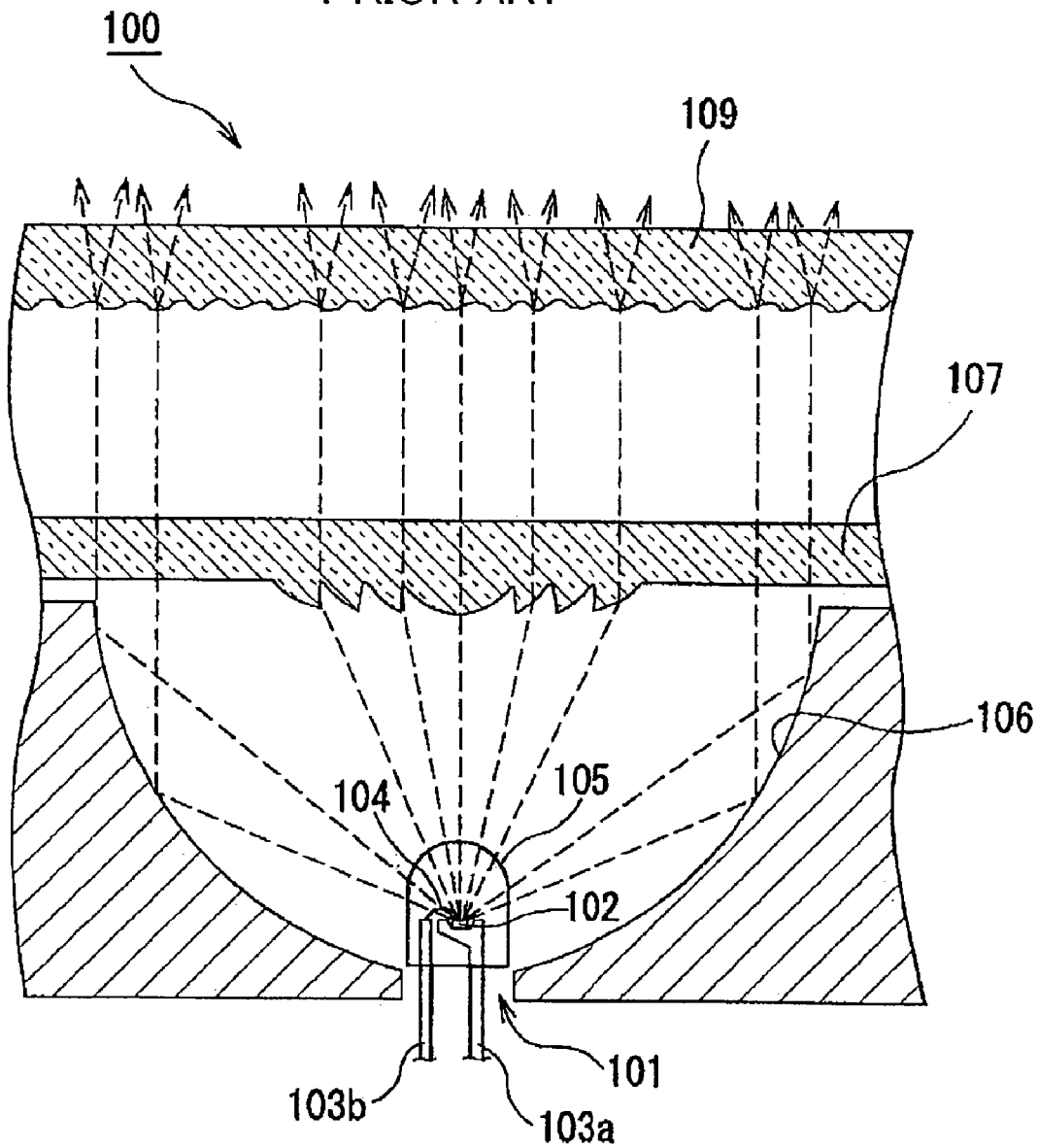
FIG. 1 is a cross-sectional view showing the whole construction of an example of a conventional light emitting apparatus.
Figure 2A:
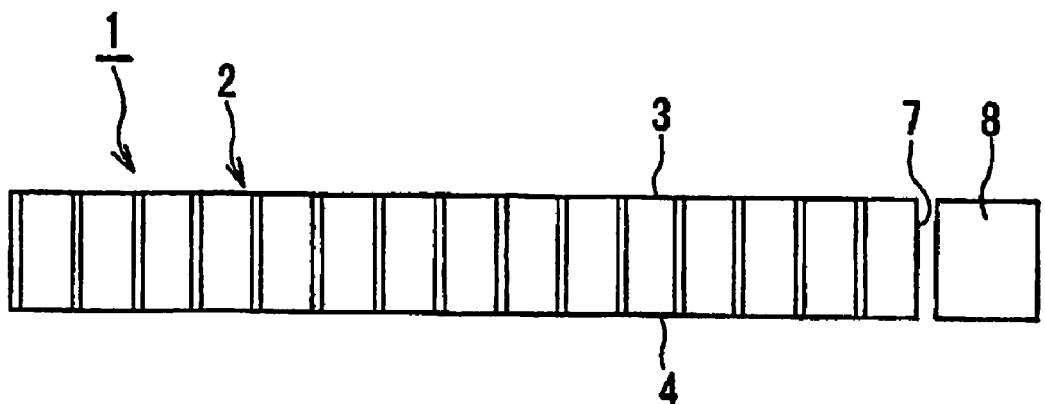
FIG. 2A is a plan view showing the whole construction of the light emitting apparatus in a first preferred embodiment of the invention.
Figure 2B:
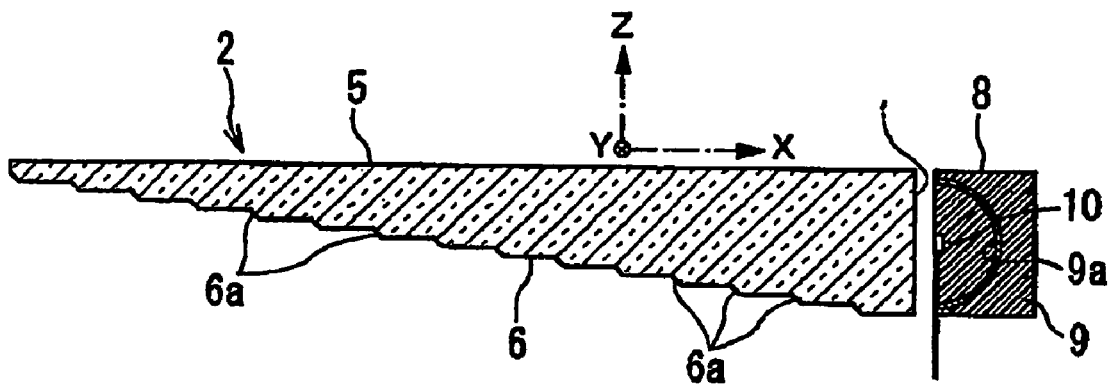
FIG. 2B is a longitudinal sectional view of the light emitting apparatus shown in FIG. 2A.
Figure 3:
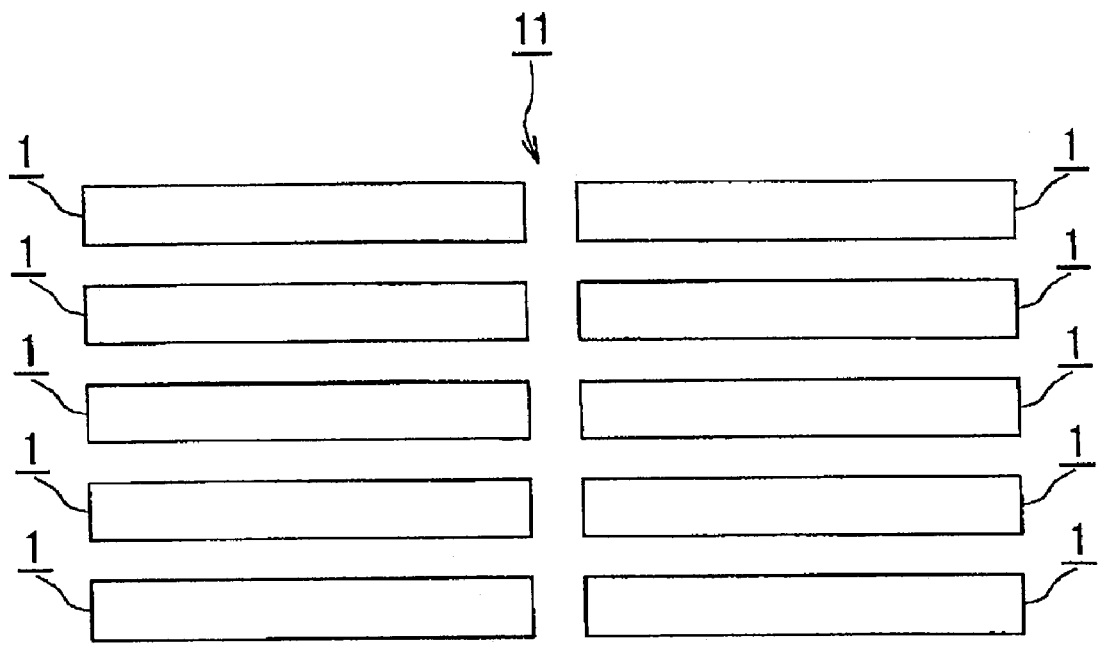
FIG. 3 is a front view showing the whole construction of a display using the light emitting apparatus in the first preferred embodiment of the invention.

FIG. 2A is a plan view showing the whole construction of the light emitting apparatus in a first preferred embodiment of the invention, FIG. 2B a longitudinal sectional view of the light emitting apparatus shown in FIG. 2A, and FIG. 3 a front view showing the whole construction of a display using the light emitting apparatus in the first preferred embodiment of the invention.

As shown in FIGS. 2A and 2B, the light emitting apparatus 1 according to preferred embodiment 1 comprises a light guide body 2 of which the body is formed of a transparent acrylic resin. A cup-type reflection LED 8 is provided contiguously to the light guide body 2. The upper surface 5 of the light guide body 2 is flat. On the other hand, the lower surface 6 of the light guide body 2 is in the form of a stepped reflecting mirror provided with a plurality of reflecting surfaces 6a. As shown in FIG. 2B, the reflecting surfaces 6a in the stepped reflecting mirror 6 are inclined at about 45 degrees to X axis in the drawing. The stepped reflecting mirror 6 and both side faces 3, 4 have been planished by vapor deposition of aluminum.

The reflection LED 8 is produced by pressing an aluminum plate having high linear reflectance to form a reflecting mirror 9a in the form of a paraboloid of revolution, setting a light emitting device 10, which has been electrically connected through a lead or a wire, so that the light emitting surface of the light emitting device 10 is located at the focal point of the paraboloid of revolution in the reflecting mirror 9a, and then sealing the whole assembly with a transparent epoxy resin 9. The reflecting mirror 9a has a solid angle of about 2πst rad to the light emitting device 10. In the reflection LED 8 having this construction, light rays are emitted from the light emitting surface of the light emitting device 10 toward the reflecting mirror 9a. The light rays are reflected from the reflecting mirror 9a. In this case, since the light emitting surface of the light emitting device 10 is located at the focal point of the paraboloid of revolution in the reflecting mirror 9a, all the light rays are reflected substantially parallel to the central axis of the paraboloid of revolution.

The light rays radiated from the reflection LED 8 are incident, from the incident face 7 of the light guide body 2, substantially parallel to the upper surface 5 of the light guide body 2. Therefore, all the light rays are reflected from any of the reflecting surfaces 6a, in the lower surface 6, inclined at about 45 degrees to the X axis, and the reflected light rays go toward Z axis. In this case, only the reflecting surfaces 6a located separately from one another at given intervals as shown in FIG. 2A shine. Since, however, the brightness of the reflected light rays is high, all the light rays are connected to one another in the direction of X axis. As a result, when this state is viewed from the direction of the upper surface 5, the whole lower surface 6 is seen uniformly shiny.

As described above, both the side faces 3, 4 have been planished. The reason for this is that, among the light rays radiated from the reflection LED 8, light rays, which have deviated from predetermined optical paths and struck both the side faces 3, 4, can also be confined in the light guide body 2, reflected from the reflecting surfaces 6a, and radiated in the direction of Z axis.

An on-vehicle stop lamp 11, which is an embodiment of a display to which the light emitting apparatus 1 in the first preferred embodiment of the invention has been applied, is shown in FIG. 3. As shown in FIG. 3, the on-vehicle stop lamp 11 comprises 10 light emitting apparatuses 1 of the type as described above. The 10 light emitting apparatuses 1 are arrayed in two columns each constituting of 5 light emitting apparatuses 1. Since the display is the stop lamp, a red light emitting device is used as the light emitting device 10 in the reflection LED 8. When the 10 light emitting apparatuses 1 are simultaneously lighted, the brightness of emitted light rays is so high that an area larger than an area obtained by multiplying the area of the light emitting apparatus 1 by the number of light emitting apparatus 1 (10) is seen shiny red. Upon lights-out of the 10 light emitting apparatuses 1, the appearance of the on-vehicle stop lamp 11 is returned to the original state as shown in FIG. 3, in which 10 transparent rectangular apparatuses are arrayed in two columns each consisting of 5 apparatuses.

Thus, in the lights-out state, an unconventional design can be observed in which 10 transparent rectangular apparatuses are arrayed in two columns each consisting of 5 apparatuses, while, in the lighted state, an area larger than an area obtained by multiplying the area of the light emitting apparatus 1 by the number of light emitting apparatus 1 is seen shiny red to allow the display to function as the stop lamp. This can realize a novel type of an on-vehicle stop lamp 11. Further, the thickness of the light emitting apparatus 1 per se is so small that the arrangement of a plurality of this type of light emitting apparatuses 1 can provide a thin and large-area on-vehicle stop lamp 11.

In the light emitting apparatus 1 in the first preferred embodiment, the stepped reflecting mirror 6 and both the side faces 3, 4 have been planished. Alternatively, the stepped reflecting mirror 6 and both the side faces 3, 4 may have not been planished. Even when the stepped reflecting mirror 6 and both the side faces 3, 4 have not been planished, a large portion of light rays among light rays radiated from the reflection LED 8 can be radiated by total reflection in the direction of Z axis.

Preferred Embodiment 2

Figure 4A:
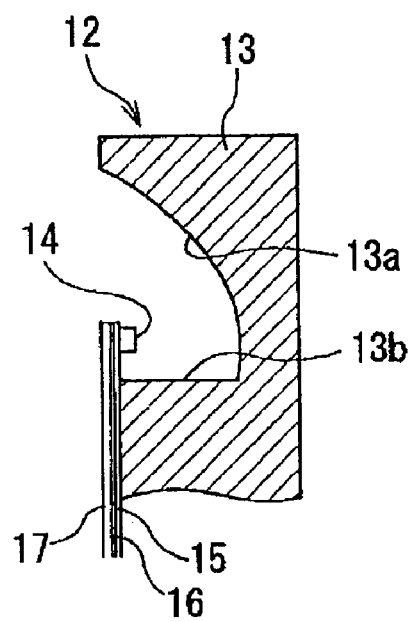
FIG. 4A is a cross-sectional view showing the construction of a light emitting section in the light emitting apparatus in a second preferred embodiment of the invention.

Next, the second preferred embodiment of the invention will be explained in conjunction with FIGS. 4A and 4B. FIG. 4A is a cross-sectional view showing the construction of a light emitting section in a light emitting apparatus 12 in the second preferred embodiment of the invention, and FIG. 4B a front view of the light emitting section in the light emitting apparatus 12 shown in FIG. 4A.

Figure 4B:
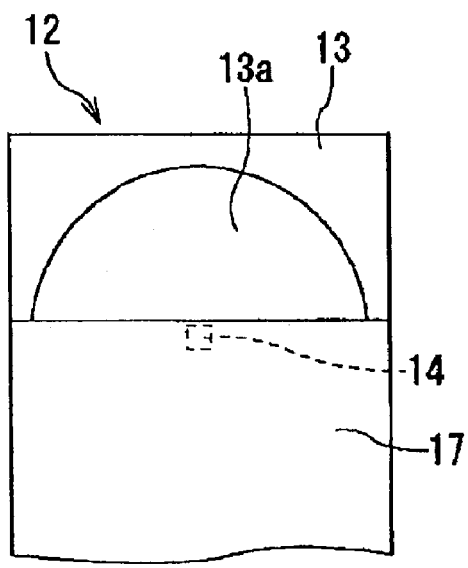
FIG. 4B is a front view of the light emitting section of the light emitting apparatus shown in FIG. 4A.

As is shown in FIGS. 4A and 4B, the light emitting apparatus 12 in the second preferred embodiment comprises a metal base substrate 17. A circuit board 15 is provided on the metal base substrate 17 through an insulating layer 16. A light emitting device 14 is mounted on the circuit board 15. The focal point of the reflecting surface 13, which faces the light emitting surface of the light emitting device 14, is the light emitting surface of the light emitting device 14. The light reflecting surface 13 comprises a paraboloid 13a of revolution having a central axis identical to a central axis of the light emitting device 14, and a flat surface 13b.

Light rays emitted from the light emitting device 14 go toward the paraboloid 13a of revolution, are reflected therefrom to the left in FIG. 4A, substantially parallel to the central axis of the light emitting device 14, and enter a light guide body (not shown) through an incident face thereof. On the other hand, light rays emitted from the light emitting device 14 to the flat surface 13b are reflected from the flat surface 13b and, as in the above case, then go toward the paraboloid 13a of revolution, are reflected therefrom to the left in FIG. 4A, substantially parallel to the central axis of the light emitting surface of the light emitting device 14, and enters the light guide body (not shown) through the incident face thereof.

By virtue of the adoption of this optical system, even when the wide metal base substrate 17 having excellent heat radiating properties as shown in FIG. 4B is used, light rays from the light emitting device 14 can be effectively emitted as condensed light to the light guide body.

As described above, the light emitting device 14 is mounted on the metal base substrate 17. This is advantageous in that the thermal conductivity is excellent, heat radiating properties are significantly improved, the supply of a large current to the light emitting device 14 does not cause heat saturation, and, thus, large optical output can be obtained. As is apparent from the foregoing description, the light emitting apparatus 12 in the second preferred embodiment of the invention is of thin type, has a high level of heat radiating properties, can provide high optical output without a restriction on heat saturation, and can provide high brightness of emitted light.

Third Preferred Embodiment

Figure 5A:
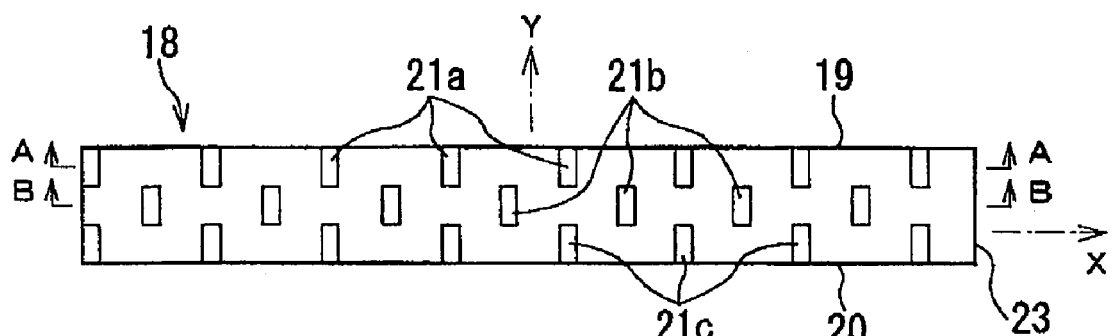
FIG. 5A is a plan view showing the construction of a light guide body in the light emitting apparatus in a third preferred embodiment of the invention.

A light emitting apparatus according to the third preferred embodiment of the invention will be explained in conjunction with FIGS. 5A, 5B, and 5C. FIG. 5A is a plan view showing the construction of a light guide body 18 in a light emitting apparatus in the third preferred embodiment of the invention, FIG. 5B a cross-sectional view taken on line A—A of FIG. 5A, and FIG. 5C a cross-sectional view taken on line B—B of FIG. 5A.

Figure 5B:
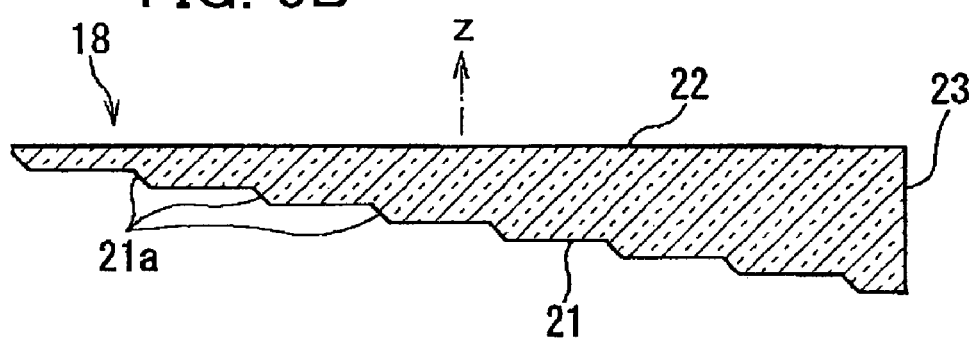
FIG. 5B is a cross-sectional view taken on line A—A of FIG. 5A.
Figure 5C:
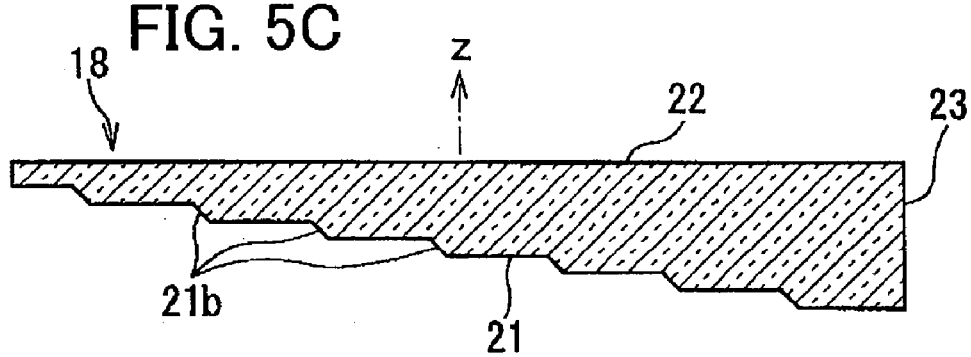
FIG. 5C is a cross-sectional view taken on line B—B of FIG. 5A.

As shown in FIGS. 5A, 5B, and 5C, in the light guide body 18 in the third preferred embodiment, the reflecting surface is split in the direction of Y, as well as in the direction of X, that is, split into reflecting surfaces 21a, 21b, 21c. In this case, the positions of the reflecting surfaces in the direction of X are shifted, and the pitch of the reflecting surfaces 21a, the pitch of the reflecting surfaces 21b, and the pitch of the reflecting surfaces 21c are intentionally made long. According to this construction, unlike the first preferred embodiment in which the whole upper surface 22 of the rectangle are artificially seen shiny, the brightness contrast is provided also in the light emitting apparatus. That is, reflected light rays are radiated at positions scattered in the rectangle on the upper surface 22, and, consequently, advantageously, radiated light rays are visually beautifully glittery. This can enhance the visibility of the emitted light rays.

Fourth Preferred Embodiment

Figure 6A:
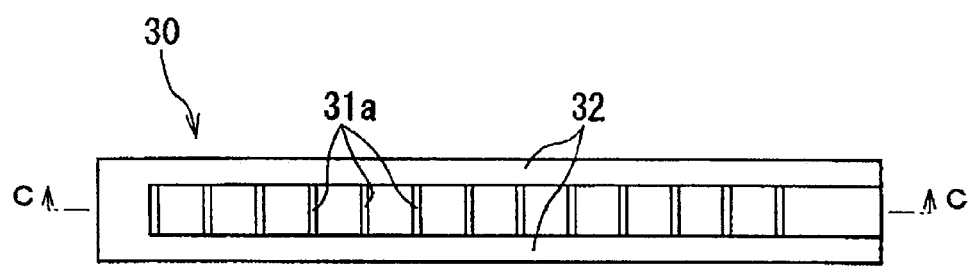
FIG. 6A is a plan view showing the construction of a split reflector in the light emitting apparatus in a fourth preferred embodiment of the invention.

Next, a light emitting apparatus according to the fourth preferred embodiment of the invention will be explained in conjunction with FIGS. 6A and 6B. FIG. 6A is a plan view showing the construction of a split reflector 30 in the light emitting apparatus in the fourth preferred embodiment of the invention, and FIG. 6B a cross-sectional view taken on line C—C of FIG. 6A.

Figure 6B:
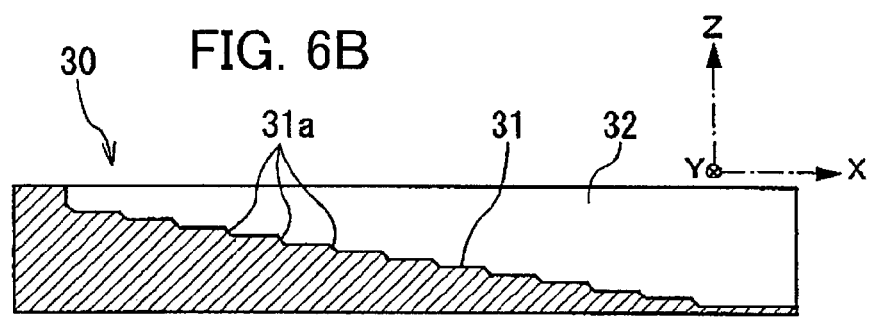
FIG. 6B is a cross-sectional view taken on line C—C of FIG. 6A.

As shown in FIGS. 6A and 6B, the construction of the split reflector 30 in the fourth preferred embodiment is such that a stepped reflection substrate 31 is surrounded by a frame 32. The upper surface of the reflection substrate 31 and the inner wall of the frame 32 have been planished by the vapor deposition of aluminum. Reflecting surfaces 31a having an angle of inclination of 45 degrees to X axis are provided at substantially equal intervals on the reflection substrate 31.

Light rays emitted from a reflection LED (not shown) located on the right-hand side of the split reflector 30 are incident substantially parallel to X axis to the split reflector 30. Therefore, all the light rays are reflected from any of the reflecting surfaces 31a inclined at about 45 degrees to the X axis of the reflection substrate 31 and go toward Z axis. In this case, only the reflecting surfaces 31a located separately from one another at given intervals as shown in FIG. 6A shine. Since, however, the brightness of the reflected light rays is high, all the light rays are connected to one another in the direction of X axis. As a result, when this state is viewed from above, the whole reflection substrate 31 is seen uniformly shiny.

The reason why the inner wall of the frame 32 has been planished is that light rays, which have deviated from predetermined optical paths and struck the inner wall of the frame 32, among the light rays emitted from the reflection LED, can also be confined in the split reflector 30, reflected from the reflecting surfaces 31a, and emitted in the direction of Z axis.

Thus, in the split reflector 30 in the fourth preferred embodiment, since light rays emitted from the reflection LED (not shown) are passed through only air atmosphere, there is no need to use the transparent material as the material of the split reflector 30. That is, any material may be used as the material of the split reflector 30 so far as the surface of the material can be planished. Further, since the light rays are passed through the air atmosphere, advantageously, the quantity of light is not reduced at all.

Fifth Preferred Embodiment

Figure 7:
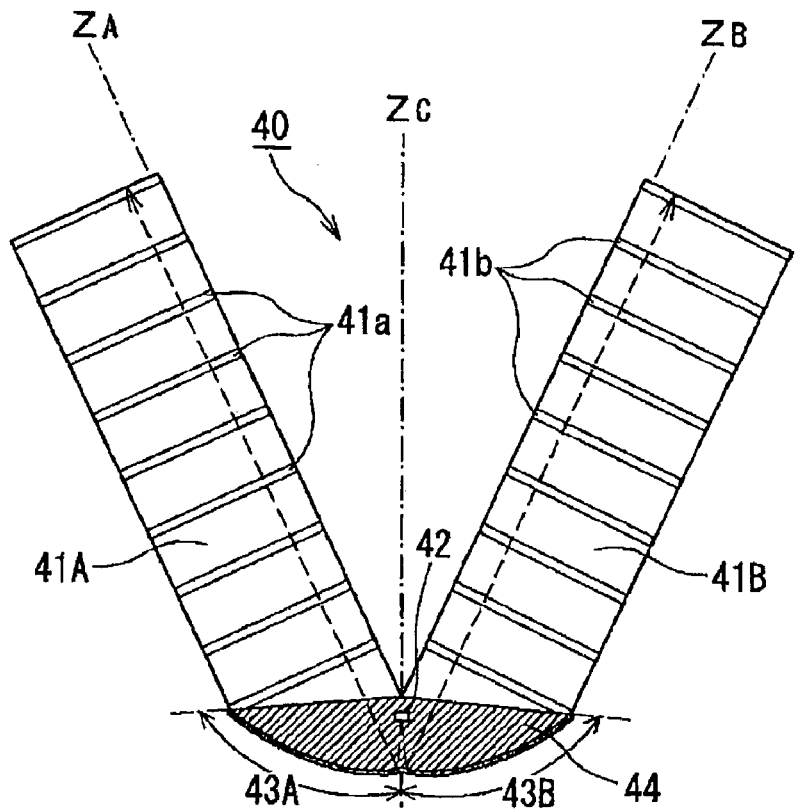
FIG. 7 is a plan view showing the whole construction of the light emitting apparatus in a fifth preferred embodiment of the invention.

A light emitting apparatus in the fifth preferred embodiment of the invention will be explained in conjunction with FIG. 7. FIG. 7 is a plan view showing the whole construction of a light emitting apparatus 40 in the fifth preferred embodiment of the invention.

As shown in FIG. 7, the construction of the light emitting apparatus 40 in the fifth preferred embodiment is such that light rays are incident from a single light emitting device 42 to two light guide bodies 41A, 41B. Specifically, the light emitting device 42 is sealed with a transparent epoxy resin 44 to construct opposed reflecting mirrors 43A, 43B wherein two paraboloids of revolution have been united with each other at a position which faces the light emitting surface of the light emitting device 42. The focal points of the paraboloids of revolution of these opposed reflecting mirrors 43A, 43B each are on the light emitting surface of the light emitting device 42. However, the central axis $Z_A$ of the opposed reflecting mirror 43A and the central axis $Z_B$ of the opposed reflecting mirror 43B are deviated from the central axis $Z_C$ of the light emitting device 42 so that the direction of the deviation of the central axis $Z_A$ of the opposed reflecting mirror 43A is opposite to the direction of the deviation of the central axis $Z_B$ of the opposed reflecting mirror 43B. The incident face of a light guide body 41A having the same construction as in the light guide body in the first preferred embodiment and the incident face of a light guide body 41B, which also has the same construction as in the light guide body in the first preferred embodiment, are abutted respectively against the emitting surfaces of the opposed reflecting mirrors 43A, 43B. The opposed reflecting mirrors 43A, 43B have a solid angle of about $2\pi$st rad to the light emitting device 42.

A plurality of sliding-split reflecting surfaces 41a are provided on the underside of the light guide body 41A, and a plurality of sliding-split reflecting surfaces 41b are provided on the underside of the light guide body 41B. Light rays, which have been emitted from the light emitting device 42 and reflected from the opposed reflecting mirrors 43A, 43B, are incident substantially parallel to the paper surface to the light guide bodies 41A, 41B. Therefore, the incident light rays are efficiently reflected and emitted substantially perpendicularly from the plurality of reflecting surfaces 41a, 41b.

Thus, in the opposed reflecting mirrors, the direction of reflection of light rays emitted from the light emitting device is not limited to one direction only, and the light rays may be reflected in two or more directions. In this case, the reflection of light rays is not limited to the reflection in a direction substantially parallel to the central axis of the light emitting device, and the direction of reflection of the light rays can be inclined at an angle to the central axis of the light emitting device.

In the first to third and fifth preferred embodiments, the material of the light guide body is a transparent acrylic resin. Other transparent materials including other transparent synthetic resins may also be used as the material of the light guide body.

Further, in each of the above preferred embodiments, an opposed reflecting mirror in the form of a paraboloid of revolution of which the focal point is the light emitting device is used for reflecting light rays emitted from the light emitting device. The form of the opposed reflecting mirror, however, is not limited to the paraboloid of revolution, and the opposed reflecting mirror may be in other forms so far as light rays emitted from the light emitting device can be efficiently reflected and go toward the stepped reflecting mirror. That is, the reflected light rays may not be necessarily parallel to one another.

Further, also for other parts of the light emitting apparatus and the display, the construction, form, necessary number, material, size, connection relationship and the like are not limited to those in the above preferred embodiments.

As is apparent from the foregoing description, according to the first feature of the invention, a light emitting apparatus comprises a light source. An opposed reflecting mirror is provided so as to face the light source. The opposed reflecting mirror is configured to reflect light rays, emitted from the light source, so as to allow the reflected light rays to advance in a predetermined direction. A light guide body having a plurality of reflecting surfaces is provided to permit the incidence of light rays supplied from the opposed reflecting mirror and to reflect the incident light rays. The plurality of reflecting surfaces are located at different positions in a sliding split manner along the direction of light rays supplied from the opposed reflecting mirror.

According to this construction, light rays emitted from the light source are reflected from the opposed reflecting mirror to allow the reflected light rays to advance in a predetermined direction. The reflected light rays enter the light guide body, where the light rays are further reflected from the plurality of reflecting surfaces provided at different positions in a sliding split manner. In this case, upon the reflection of light rays from the light guide body, only the plurality of sliding-split-type reflecting surfaces shine. Since, however, the brightness of the reflected light rays is high, all the reflected light rays are connected to one another. As a result, the whole light guide body is artificially seen shiny.

Thus, a light emitting apparatus can be provided in which, while making the best use of a feature of LED, i.e., a small thickness, impressive illumination of an elongated shape by one light emitting device and high external emission efficiency can be realized.

According to the second feature of the invention, a light emitting apparatus comprises a light source. An opposed reflecting mirror is provided so as to face the light source. The opposed reflecting mirror is configured to reflect light rays, emitted from the light source, so as to allow the reflected light rays to advance in a predetermined direction. A split reflector having a plurality of reflecting surfaces is provided to permit the incidence of light rays supplied from the opposed reflecting mirror and to reflect the incident light rays from the surfaces thereof. The plurality of reflecting surfaces are located at different positions in a sliding split manner along the direction of light rays supplied from the opposed reflecting mirror.

The light emitting apparatus in the second feature of the invention is different from the light emitting apparatus in the first feature of the invention in that the incident light rays supplied from the opposed reflecting mirror are passed through only air atmosphere and are reflected from the surface of the split reflector. Since light rays are passed through only air atmosphere, there is no need to use a transparent material as the material of the split reflector. That is, any material may be used as the material of the split reflector so far as the surface of the material can be planished. Further, since the light rays are passed through the air atmosphere, advantageously, the quantity of light is not reduced at all. Here, upon the reflection of light rays from the split reflector, only the plurality of sliding-split-type reflecting surfaces shine. Since, however, the brightness of the reflected light rays is high, as with the first feature of the invention, all the reflected light rays are connected to one another. As a result, the whole split reflector is artificially seen shiny.

Thus, a light emitting apparatus can be provided in which, while making the best use of a feature of LED, i.e., a small thickness, impressive illumination of an elongated shape by one light emitting device and high external emission efficiency can be realized.

In the light emitting apparatus according to the first or second feature of the invention, the light source may be a light emitting device or an LED lamp comprising a light emitting device sealed with a light transparent material.

Since any of a light emitting device and an LED lamp may be used as the light source, in addition to the effect attained by the first or second feature of the invention, a further effect can be attained such that displays of a novel design, such as on-vehicle lights, can be realized.

In the light emitting apparatus according to the first or second feature of the invention, preferably, the plurality of reflecting surfaces have been split also in a direction perpendicular to a direction of incidence of light rays supplied from the opposed reflecting mirror, and the split reflecting surfaces are different from each other or one another in distance from the opposed reflecting mirror.

According to this construction, the plurality of reflecting surfaces in the light emitting apparatus are split in the lengthwise direction, as well as in crosswise direction. In this case, in addition to the effect attained by the first or second feature of the invention, a further effect can be attained such that the whole light guide body or the whole split reflector is not artificially seen shiny, and, instead, the brightness contrast is provided also in the light guide body per se or the split reflector per se. That is, reflected light rays are emitted at scattered positions, and, consequently, advantageously, emitted light rays are visually beautifully glittery. This can enhance the visibility of the emitted light rays.

In the light emitting apparatus according to the first or second feature of the invention, preferably, the light source is mounted on a wide substrate and the opposed reflecting mirror comprises a first reflecting surface and a second reflecting surface, a part of the wide substrate is attached to a body constituting the opposed reflecting mirror, the light source faces the first reflecting surface, the first reflecting surface is configured to reflect light rays emitted from the light source so as to allow the reflected light rays to advance in a predetermined direction, and the second reflecting surface is extended to the attached substrate and is configured to reflect light rays emitted from the light source so as to allow the reflected light rays to advance toward the first reflecting surface.

According to this construction, in addition to the effect attained by the first or second feature of the invention, the following further effect can be attained. Light rays emitted from the light source to the first reflecting surface are reflected, and the reflected light rays advance in a predetermined direction and are incident to the light guide body or the split reflector through the incident face thereof. On the other hand, light rays emitted from the light source to the second reflecting surface are reflected from the second reflecting surface. Thereafter, as with the light rays emitted from the light source to the first reflecting surface, the light rays reflected from the second reflecting surface are reflected from the first reflecting surface so as to allow the reflected light rays to advance in a predetermined direction, and the light rays reflected from the first reflecting surface are incident to the light guide body or the split reflector through the incident face thereof.

The above optical system is advantageous in that, even when a wide substrate is used, light rays emitted from the light source can be effectively emitted as condensed light to the light guide body or the split reflector.

In the light emitting apparatus according to the first or second feature of the invention, the opposed reflecting mirror is preferably a part of a paraboloid of revolution of which the focal point is the light emitting surface of the light source.

According to this construction, in addition to the effect attained by the first or second feature of the invention, a further effect can be attained such that, since light rays emitted from the light source are reflected, from the opposed reflecting mirror, substantially parallel to the central axis of the paraboloid of revolution, the light rays reflected from the opposed reflecting mirror can efficiently enter the reflecting surfaces of the light guide body or the split reflector and can be emitted to the outside of the system with high external emission efficiency.

According to the third feature of the invention, a display comprises a plurality of light emitting apparatuses of the type according to the first or second feature of the invention. In this display, the plurality of light emitting apparatuses are arrayed at predetermined intervals.

According to this construction, in addition to the effect attained by the first or second feature of the invention, the following further effect can be attained. Specifically, when the plurality of light emitting apparatuses are simultaneously lighted, the brightness of emitted light rays is so high that an area larger than an area obtained by multiplying the area of the light emitting apparatus by the number of light emitting apparatuses is seen shiny. Upon lights-out of the light emitting apparatuses, the appearance of the display is returned to the original state, in which the plurality of light emitting apparatuses are arrayed at predetermined intervals.

Thus, in the lights-out state, a novel and unconventional design can be observed in which the plurality of light emitting apparatuses are arrayed at predetermined intervals, while, in the lighted state, an area larger than an area obtained by multiplying the area of the light emitting apparatus by the number of light emitting apparatuses is seen shiny to allow the display to function as a display. Thus, a novel and unconventional display can be realized. Further, the thickness of the light emitting apparatus per se is so small that the arrangement of a plurality of this type of light emitting apparatuses can provide a thin and large-area display.

The invention has been described in detail with particular reference to preferred embodiments, but it will be understood that variations and modifications can be effected within the scope of the invention as set forth in the appended claims.

What is claimed is:
1. A light emitting apparatus comprising:
    a light source;
    an opposed reflecting mirror that includes a solid angle of substantially 2π strad to the light source and reflects light rays, emitted from the light source, and allows reflected light rays to advance in a predetermined direction; and
    a light guide body including a plurality of reflecting surfaces that reflect incident light rays supplied from the opposed reflecting mirror, wherein the plurality of reflecting surfaces are located at different positions in a sliding split manner along said predetermined direction of light rays supplied from the opposed reflecting mirror, and wherein, in the light guide body, the plurality of reflecting surfaces include split reflecting surfaces that are split in a direction perpendicular to a direction of incidence of light rays supplied from the opposed reflecting mirror, and the split reflecting surfaces are different from each other in distance from the opposed reflecting mirror.

2. A display comprising a plurality of light emitting apparatuses according to claim 1, wherein said plurality of light emitting apparatuses are disposed in an array including predetermined intervals.

3. The light emitting apparatus according to claim 1, wherein the plurality of reflecting surfaces are located at predetermined positions, along said light guide body in said predetermined direction of light rays supplied from the opposed reflecting mirror, to illuminate substantially an entire area of said light guide body.

4. The light emitting apparatus according to claim 1, wherein said light emitting apparatus comprises an array of light emitting apparatuses spaced at predetermined intervals.

5. The light emitting apparatus according to claim 1, wherein said light guide body includes an elongated light guide body extending in said predetermined direction.

6. The light emitting apparatus according to claim 1, wherein the opposed reflecting mirror includes a paraboloid of revolution, and wherein the predetermined direction of light rays includes a direction substantially parallel to a central axis of the paraboloid of revolution.

7. The light emitting apparatus according to claim 1, wherein the light source includes at least one of a light emitting device and an LED lamp comprising a light emitting device.

8. A light emitting apparatus comprising:
a light source;
an opposed reflecting mirror that reflects light rays, emitted from the light source, and allows reflected light rays to advance in a predetermined direction; and
a split reflector including a plurality of reflecting surfaces that reflects, from the surfaces, incident light rays supplied from the opposed reflecting mirror,
wherein the plurality of reflecting surfaces are located at different positions in a sliding split manner along the direction of light rays supplied from the opposing reflecting mirror,
wherein the light source is mounted on a substrate,
wherein the opposed reflecting mirror comprises a first reflecting surface and a second reflecting surface,
wherein a part of the substrate is attached to a body including the opposed reflecting mirror,
wherein the light source faces the first reflecting surface,
wherein the first reflecting surface reflects light rays emitted from the light source and allows the reflected light rays to advance in a predetermined direction, and
wherein the second reflecting surface is extended to the attached substrate, reflects light rays emitted from the light source, and allows the reflected light rays to advance toward the first reflecting surface.

9. The light emitting apparatus according to claim 8, wherein said split reflector comprises a stepped reflective substrate.

10. The light emitting apparatus according to claim 9, wherein said split reflector comprises a frame surrounding said stepped reflective substrate.

11. The light emitting apparatus according to claim 10, wherein at least one of an upper surface of said plurality of reflecting surfaces and an inner wall of said frame include a planished surface.

12. The light emitting apparatus according to claim 10, wherein at least one of an upper surface of said plurality of reflecting surfaces and an inner wall of said frame includes a planished aluminum surface.

13. The light emitting apparatus according to claim 8, wherein an angle of inclination of said reflecting surfaces is substantially equal to 45 degrees.

14. The light emitting apparatus according to claim 8, wherein said plurality of reflecting surfaces are disposed at predetermined positions along said reflecting mirror.

15. The light emitting apparatus according to claim 8, wherein said light rays emitted from said opposed reflecting mirror pass through a void between said opposed reflecting mirror and said plurality of reflecting surfaces.

16. The light emitting apparatus according to claim 8, wherein said light rays emitted from said opposed reflecting mirror do not pass through said split reflector.

17. The light emitting apparatus according to claim 8, wherein said split reflector comprises an opaque substrate.

18. A light emitting apparatus comprising:
a light source;
an opposed reflecting mirror that reflects light rays, emitted from the light source, and allows reflected light rays to advance in a predetermined direction; and
a light guide body including a plurality of reflecting surfaces that reflect incident light rays supplied from the opposed reflecting mirror,
wherein the plurality of reflecting surfaces are located at different positions in a sliding split manner along said predetermined direction of light rays supplied from the opposed reflecting mirror,
wherein the light source is mounted on a substrate,
wherein the opposed reflecting mirror comprises a first reflecting surface and a second reflecting surface,
wherein a part of the substrate is attached to a body including the opposed reflecting mirror,
wherein the light source faces the first reflecting surface,
wherein the first reflecting surface reflects light rays emitted from the light source and allows the reflected light rays to advance in a predetermined direction, and
wherein the second reflecting surface is extended to the attached substrate, reflects light rays emitted from the light source, and allows the reflected light rays to advance toward the first reflecting surface.

19. The light emitting apparatus according to claim 18, wherein the opposed reflecting mirror includes a paraboloid of revolution, and wherein a focal point of said opposed reflecting mirror includes the light emitting surface of the light source.

20. The light emitting apparatus according to claim 18, wherein said light emitting apparatus comprises a plurality of light emitting apparatuses disposed in an array in a same plane.

21. The light emitting apparatus according to claim 18, wherein the light source includes at least one of a light emitting device and an LED lamp comprising a light emitting device sealed with a light transparent material.

22. A light emitting apparatus comprising:
a light source;
an opposed reflecting mirror that includes a solid angle of substantially $2\pi$ strad to the light source and reflects light rays, emitted from the light source, and allows reflected light rays to advance in a predetermined direction; and a light guide body including a plurality of reflecting surfaces that reflect incident light rays supplied from the opposed reflecting mirror, wherein the plurality of reflecting surfaces are located at different positions in a sliding split manner along said predetermined direction of light rays supplied from the opposed reflecting mirror, and wherein said light emitting apparatus comprises a plurality of light emitting apparatuses disposed in an array and extending radially from said light source.

23. The light emitting apparatus according to claim 22, wherein the light source includes at least one of a light emitting device and an LED lamp comprising a light emitting device.

24. A light emitting apparatus comprising:
a light source;
a reflecting mirror opposed to said light source that reflects light rays emitted from said light source in a predetermined direction; and
an elongated light guide body that receives incident light rays from the reflecting mirror,
wherein said elongated light guide body comprises:
a proximal end and a distal end, wherein said proximal end is disposed proximate said light source, and
a plurality of stepped reflecting surfaces extending from said proximal end to said distal end,
wherein the light source is mounted on a substrate,
wherein the opposed reflecting mirror comprises a first reflecting surface and a second reflecting surface,
wherein a part of the substrate is attached to a body including the opposed reflecting mirror,
wherein the light source faces the first reflecting surface,
wherein the first reflecting surface reflects light rays emitted from the light source and allows the reflected light rays to advance in a predetermined direction, and
wherein the second reflecting surface is extended to the attached substrate, reflects light rays emitted from the light source, and allows the reflected light rays to advance toward the first reflecting surface.

25. The light emitting apparatus according to claim 24, wherein a distance between each one of said plurality of stepped reflecting surfaces and said light source increases in a direction extending from said proximal end to said distal end.

26. The light emitting apparatus according to claim 24, wherein at least one of said plurality of reflecting surfaces includes an inclined reflecting surface.

27. The light emitting apparatus according to claim 26, wherein said inclined reflecting surface includes an angle of incline substantially equal to 45° from said direction extending from said proximal end to said distal end.

28. The light emitting apparatus according to claim 24, wherein at least one of said plurality of reflecting surfaces and side faces of said elongated light guide body includes a planished surface.

29. The light emitting apparatus according to claim 24, wherein said plurality of stepped reflecting surfaces are disposed at a predetermined interval along said elongated light guide body extending from said proximal end to said distal end.

30. The light emitting apparatus according to claim 24, wherein said elongated light guide body guides substantially all of said incident light rays to said plurality of reflecting surfaces, thereby obtaining substantially total reflection of said light rays and providing an appearance of illuminating substantially all of the light guide body.

* * * * *